United States Patent
Low

(10) Patent No.: US 7,528,391 B2
(45) Date of Patent: May 5, 2009

(54) TECHNIQUES FOR REDUCING CONTAMINATION DURING ION IMPLANTATION

(75) Inventor: Russell J. Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 231 days.

(21) Appl. No.: 11/615,386

(22) Filed: Dec. 22, 2006

(65) Prior Publication Data

US 2008/0149856 A1    Jun. 26, 2008

(51) Int. Cl.
*G21K 1/08* (2006.01)
(52) U.S. Cl. ............... 250/492.21; 250/398; 250/396 R; 250/491.1; 250/492.1; 250/492.2; 250/492.3
(58) Field of Classification Search ........... 250/400, 250/453.1, 398, 396 R, 492.21, 492.2, 492.1, 250/492.3, 492.22, 491.1
See application file for complete search history.

(56) References Cited

U.S. PATENT DOCUMENTS

| | | | | |
|---|---|---|---|---|
| 3,999,097 | A * | 12/1976 | Ko et al. | 313/361.1 |
| 4,182,958 | A * | 1/1980 | Goto et al. | 250/492.2 |
| 4,453,080 | A | 6/1984 | Berkowitz | |
| 5,126,571 | A | 6/1992 | Sakai | |
| 6,171,641 | B1 | 1/2001 | Okamoto et al. | |
| 6,583,428 | B1 | 6/2003 | Chipman et al. | |
| 2003/0197133 | A1 * | 10/2003 | Turner et al. | 250/492.21 |
| 2005/0040031 | A1 * | 2/2005 | Burtner et al. | 204/192.12 |
| 2006/0289798 | A1 * | 12/2006 | Cummings et al. | 250/492.21 |
| 2007/0045569 | A1 * | 3/2007 | Walther et al. | 250/492.21 |
| 2007/0091538 | A1 | 4/2007 | Buchberger et al. | |
| 2008/0067434 | A1 * | 3/2008 | Walther et al. | 250/492.21 |
| 2008/0073569 | A1 * | 3/2008 | Teodorczyk et al. | 250/491.1 |
| 2008/0078949 | A1 * | 4/2008 | Benveniste | 250/492.21 |
| 2008/0087844 | A1 * | 4/2008 | Nunan et al. | 250/492.2 |

FOREIGN PATENT DOCUMENTS

WO    20040102640 A1    11/2004
WO    20080020972 A2    2/2008

* cited by examiner

*Primary Examiner*—Jack I Berman
*Assistant Examiner*—Nicole Ippolito Rausch

(57) ABSTRACT

Techniques for reducing contamination during ion implantation is disclosed. In one particular exemplary embodiment, the techniques may be realized by an apparatus for reducing contamination during ion implantation. The apparatus may comprise a platen to hold a workpiece for ion implantation by an ion beam. The apparatus may also comprise a mask, located in front of the platen, to block the ion beam and at least a portion of contamination ions from reaching a first portion of the workpiece during ion implantation of a second portion of the workpiece. The apparatus may further comprise a control mechanism, coupled to the platen, to reposition the workpiece to expose the first portion of the workpiece for ion implantation.

20 Claims, 6 Drawing Sheets

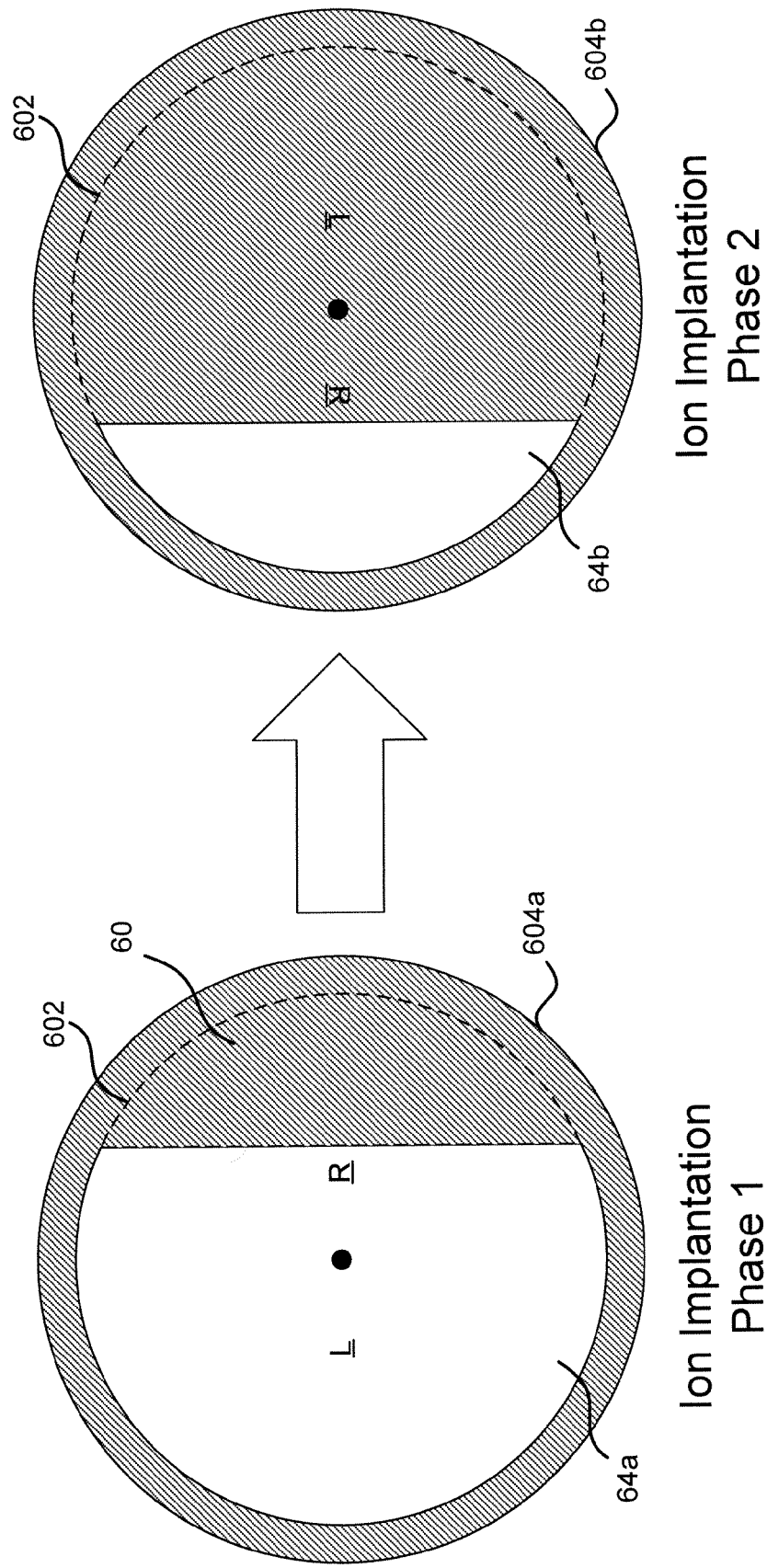

TECHNIQUES FOR REDUCING CONTAMINATION DURING ION IMPLANTATION

CROSS-REFERENCE TO RELATED APPLICATIONS

This patent application is related to U.S. patent application Ser. No. 11/329,761, filed Jan. 11, 2006, which claims priority to U.S. Provisional Patent Application No. 60/660,420, filed Mar. 9, 2005, each of which is hereby incorporated by reference herein in its entirety.

FIELD OF THE DISCLOSURE

The present disclosure relates generally to semiconductor manufacturing and, more particularly, to techniques for reducing contamination during ion implantation.

BACKGROUND OF THE DISCLOSURE

Ion implanters are widely used in semiconductor manufacturing to selectively alter the conductivity of materials. In a typical ion implanter, ions generated from an ion source are transported as an ion beam downstream through a series of beamline components which may include one or more analyzer and/or corrector magnets and a plurality of electrodes. The analyzer magnets may be used to select desired ion species and filter out contaminant species or ions having undesirable energies. The corrector magnets may be used to manipulate the shape of the ion beam or otherwise adjust the ion beam quality before it reaches a target wafer. Suitably shaped electrodes can be used to modify the energy and the shape of the ion beam. After the ion beam has been transported through the series of beamline components, it may be directed into an end station to perform ion implantation.

FIG. 1 depicts a conventional ion implanter system 100. As is typical for most ion implanters, the system 100 is housed in a high-vacuum environment. The ion implanter system 100 may comprise an ion source 102 and a series of beamline components through which an ion beam 10 passes. The series of beamline components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 118. The target wafer 118 is typically housed in a wafer end-station (not shown) under high vacuum.

In semiconductor manufacturing, ion implantation of a target wafer is often performed on only selected areas of the wafer surface, while the rest of the wafer surface is typically masked with a photosensitive material known as "photoresist." Through a photolithography process, the target wafer may be coated with a patterned layer of photoresist material, exposing only selected areas of the wafer surface where ion implantation is desired. During ion implantation, an ion beam makes its impact not only on the exposed portion of the wafer surface, but also on the photoresist layer. The energetic ions often break up chemical bonds within the photoresist material and release volatile organic chemicals and/or other particles into the vacuum chamber (i.e., wafer end-station) that houses the target wafer. This phenomenon is known as "photoresist outgassing." Photoresist outgassing in an ion implanter can have several deleterious effects on an ion beam. For example, the particles released from the photoresist may cause a pressure increase or pressure fluctuations in the high-vacuum wafer end-station. The outgassed particles may also migrate upstream from the wafer end-station to other beamline components, such as the corrector magnet 116 and the scanner 114 as shown in FIG. 1, and may affect vacuum levels in those portions of the ion implanter as well.

The outgassed particles and/or contamination particles from other sources often interact with an incident ion beam by exchanging charges with beam ions. For example, an ion with a single positive charge may lose its charge to an outgassed particle and become neutralized; a doubly charged ion may lose one positive charge to an outgassed particle and become singly charged; and so on. As a result, the outgassing-induced charge exchange can interfere with an ion dosimetry system in the ion implanter.

A typical ion dosimetry system determines ion doses by integrating a measured beam current over time and converting the integrated beam current (i.e., total ion charges) to a total dose based on an assumption that a particular ion species has a known charge state. The outgassing-induced charge exchange, however, randomly alters the charge state of the ion species, thereby invalidating the charge-state assumption that the ion dosimetry system relies on. For example, if the outgassed particles tend to rob positive charges from positive ions, then such charge exchange will cause the dosimetry system to undercount that ion species, which in turn leads to an over-supply of that ion species to a target wafer.

Due to the above-mentioned upstream migration of outgassed particles, as well as other sources of contamination, charge exchange may occur in or near a corrector magnet. Charge-altered ions are subject to a different Lorentz force as compared to those same species of ions that experience no charge exchange. As such, the charge-altered ions will deviate from the main ion beam path, resulting in non-uniform dosing of the target wafer. Beamlets formed by streams of the charge-altered ions are referred to hereinafter as "parasitic beamlets."

FIG. 2 illustrates ion trajectories for charge-altered ions during ion implantation with multiple-charged ions. In this example, doubly-charged phosphorous ions ($P^{2+}$) 20 are generated for ion implantation of a target wafer 202. Charge exchange occurring in a corrector magnet 204 may cause the $p^{2+}$ ions 20 to either lose or gain a positive charge, introducing contamination ions $P^+$ 22 and $P^{3+}$ 24 respectively. Compared to the $P^{2+}$ ions 20, the $P^+$ ions 22 will be bent less by the magnetic field in the corrector magnet 204 and therefore tend to deviate towards the "outside" of the target wafer 202. In contrast, the $P^{3+}$ ions 24 will be bent more by the magnetic field in the corrector magnet 204 and therefore tend to deviate towards the "inside" of the target wafer 202. Note that the contamination ions 22 and 24 may either miss the target wafer 202 completely or hit the target wafer 202 at angles different from the $P^{2+}$ ions 20. These contamination ions at unintended angles will affect an ultimate dopant profile in the target wafer 202.

In view of the foregoing, it would be desirable to provide techniques for reducing contamination during ion implantation which overcomes the above-described inadequacies and shortcomings.

SUMMARY OF THE DISCLOSURE

Techniques for reducing contamination during ion implantation are disclosed. In one particular exemplary embodiment, the techniques may be realized by an apparatus for reducing contamination during ion implantation. The apparatus may comprise a platen to hold a workpiece for ion implantation by an ion beam. The apparatus may also comprise a mask, located in front of the platen, to block the ion beam and at least a portion of contamination ions from reaching a first portion of the workpiece during ion implantation of a second portion of the workpiece. The apparatus may further comprise a control mechanism, coupled to the platen, to reposition the workpiece to expose the first portion of the workpiece for ion implantation.

In accordance with other aspects of this particular exemplary embodiment, the second portion may comprise the remaining portion of the workpiece.

In accordance with further aspects of this particular exemplary embodiment, the first portion may comprise one half of the workpiece, and the second portion may comprise the other half of the workpiece. Accordingly, the mask may have a semi-circular shape.

In accordance with additional aspects of this particular exemplary embodiment, the mask may remain in a fixed relative position with respect to the ion beam during the ion implantation of the first portion and the second portion of the workpiece, and the fixed relative position may be chosen based on a likelihood of impact by the contamination ions.

In accordance with another aspect of this particular exemplary embodiment, the mask may be made from one or more materials selected from a group consisting of: silicon, carbon, and silicon carbide.

In accordance with yet another aspect of this particular exemplary embodiment, the control mechanism may reposition the workpiece by rotating the workpiece by a predetermined angle.

In accordance with still another aspect of this particular exemplary embodiment, the ion implantation on the first portion of the workpiece may be based on a recipe different from the ion implantation on the second portion of the workpiece.

In accordance with a further aspect of this particular exemplary embodiment, the ion beam may be a ribbon beam, and the ion implantation of the first portion and the second portion of the workpiece may be performed by translating the workpiece and the mask relative to the ribbon beam.

In another particular exemplary embodiment, the techniques may be realized by a method for reducing contamination during ion implantation. The method may comprise positioning a mask in front of a workpiece to block an ion beam and at least a portion of contamination ions from reaching a first portion of the workpiece during ion implantation of a second portion of the workpiece. The method may also comprise repositioning the workpiece, after the ion implantation of the second portion, to expose the first portion of the workpiece for ion implantation.

In accordance with other aspects of this particular exemplary embodiment, the mask may remain in a fixed relative position with respect to the ion beam during the ion implantation of the first portion and the second portion of the workpiece, and the fixed relative position may be chosen based on a likelihood of impact by the contamination ions.

In accordance with further aspects of this particular exemplary embodiment, the second portion may comprise remaining portion of the workpiece.

In accordance with additional aspects of this particular exemplary embodiment, the first portion may comprise one half of the workpiece, and the second portion may comprise the other half of the workpiece. Accordingly, the mask may have a semi-circular shape. Alternatively, the mask may have a rectangular shape.

In accordance with another aspect of this particular exemplary embodiment, the step of repositioning the workpiece may comprise a step of rotating the workpiece by a predetermined angle.

In accordance with yet another aspect of this particular exemplary embodiment, the ion implantation on the first portion of the workpiece may be based on a recipe different from the ion implantation on the second portion of the workpiece.

In accordance with still another aspect of this particular exemplary embodiment, the ion beam may be a ribbon beam, and the ion implantation of the first portion and the second of the workpiece may be performed by translating the workpiece and the mask relative to the ribbon beam.

In yet another particular exemplary embodiment, the techniques may be realized by at least one signal embodied in at least one carrier wave for transmitting a computer program of instructions configured to be readable by at least one processor for instructing the at least one processor to execute a computer process for performing the method as recited above.

In still another particular exemplary embodiment, the techniques may be realized by at least one processor readable carrier for storing a computer program of instructions configured to be readable by at least one processor for instructing the at least one processor to execute a computer process for performing the method as recited above.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 6 illustrates an exemplary method for reducing contamination based on two complementary masks or an adjustable mask in accordance with an embodiment of the present disclosure.

DETAILED DESCRIPTION OF EXEMPLARY EMBODIMENTS

Embodiments of the present disclosure may reduce contamination from undesired ions, especially during ion implantation with multiple-charged ions, by splitting the ion implantation process of a workpiece (e.g., a semiconductor wafer) into two or more phases. A portion of the workpiece having a relative position with respect to an incoming ion beam may be identified as most likely to be affected by contamination ions or parasitic beamlets. That portion of the workpiece may be masked during a first phase of the ion implantation process while the rest of the workpiece is exposed to the incoming ion beam. In a second phase of the ion implantation process, the workpiece may be rotated such that the previously masked portion may be exposed to the incoming ion beam. In this way, it may be ensured that only a trusted portion of the ion beam is used for ion implantation of the workpiece.

Figure 1:
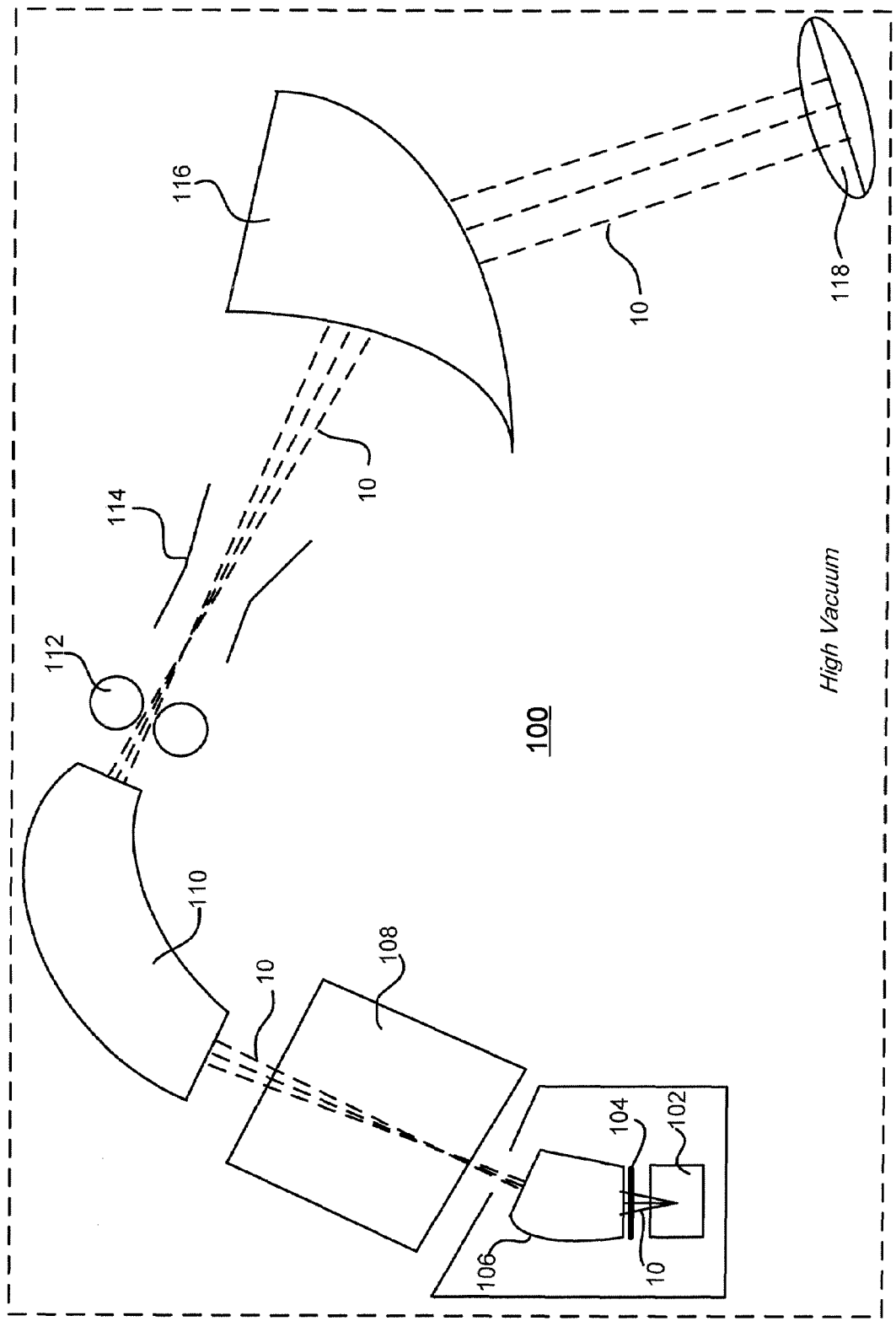
FIG. 1 shows a conventional ion implanter.
Figure 2:
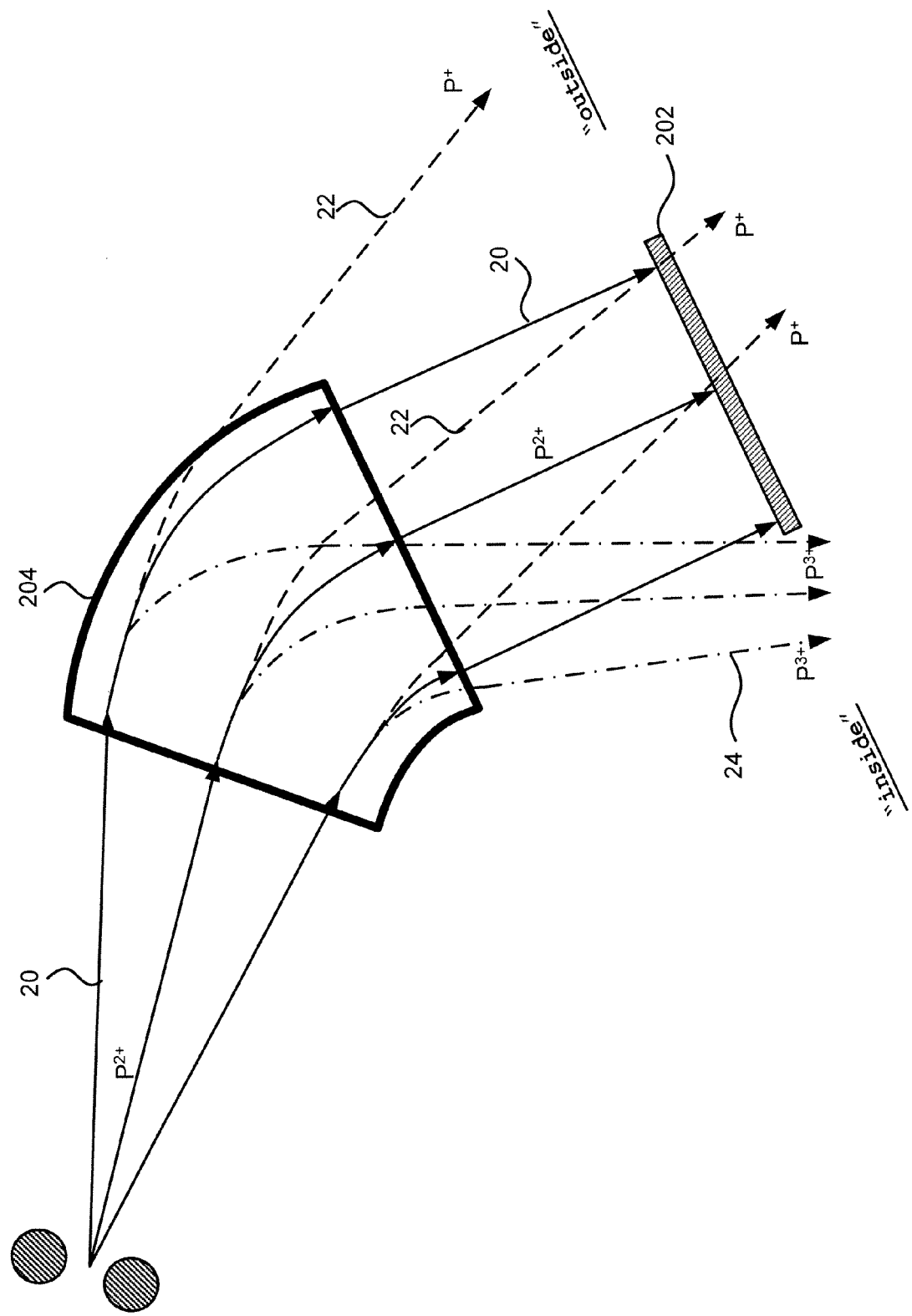
FIG. 2 illustrates ion trajectories for charge-altered ions during ion implantation with multiple-charged ions.
Figure 3:
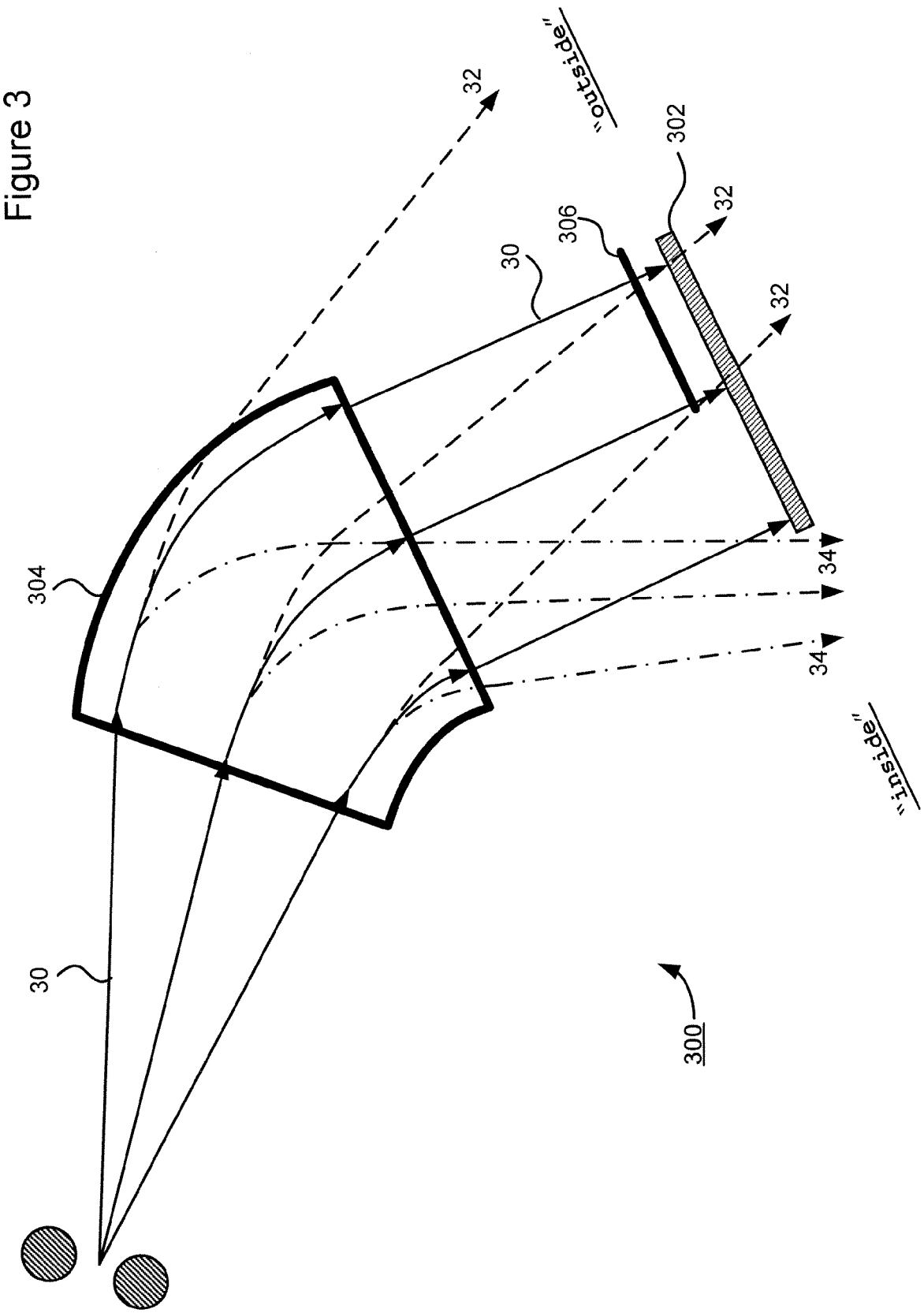
FIG. 3 shows an exemplary system for reducing contamination during ion implantation in accordance with an embodiment of the present disclosure.

Referring to FIG. 3, there is shown an exemplary system 300 for reducing contamination during ion implantation in accordance with an embodiment of the present disclosure.

In this example, multiple-charged ions 30 are generated for ion implantation of a target wafer 302. Charge exchange occurring in or near a corrector magnet 304 may cause the ions 30 to either lose or gain a positive charge, introducing contamination ions 32 and 34, respectively. Since the ions 32 are bent less by the magnetic field in the corrector magnet 304 and therefore tend to hit the "outside" half of the target wafer 302, while the ions 34 are bent more by the magnetic field in the corrector magnet 304 and therefore tend to miss the target wafer 302 on the "inside," it may be recognized that the "outside" half of the target wafer 302 is more likely to see contamination ions or parasitic beamlets (i.e., ions 32). Therefore, a mask 306 may be positioned in front of the target wafer 302 to prevent all ions (including ions 30 and 32) from reaching the "outside" half of the target wafer 302 during ion implantation.

To block the "outside" half of the target wafer 302, the mask 306 may have a half-moon shape and may be at least as large as half of the target wafer 302. The mask 306 may be made from one or more materials that have little or no contamination effect on the target wafer 302. For example, the mask 306 may be made of silicon, carbon, or silicon carbide.

With the mask 306 in position, only the "inside" half of the target wafer 302 is exposed for ion implantation. The ion beam 30 may be typically a static or scanned ribbon beam with a beam width of at least the radius (or diameter) of the target wafer 302. A static ribbon beam may typically comprise a plurality of parallel beamlets that span the beam width. A scanned ribbon beam may be formed by scanning a spot beam, typically with an electrostatic or magnetic scanner, back and forth over the "beam width" at a relatively fast frequency. The target wafer 302 may be translated relative to the ion beam 30 in one or more scan passes to ensure uniform beam coverage of the exposed wafer surface.

Once the "inside" half of the target wafer 302 has been implanted, the target wafer 302 may be rotated 180° such that the previous "inside" and "outside" halves have their positions reversed. That is, after the rotation and with the mask 306 still in position, the previously masked half-wafer may now be exposed, and the previously exposed half-wafer may now be masked. After the rotation, the ion implantation may be repeated with either the same or different recipes and/or parameters.

Therefore, in a two-phase ion implantation process, both halves of the target wafer 302 may be implanted. And, both phases are based on a "trusted" portion (i.e., "inside" half) of the ion beam 30. As a result, at least the contamination ions or parasitic beamlets in the "outside" half of the ion beam 30 may be avoided.

Figure 4:
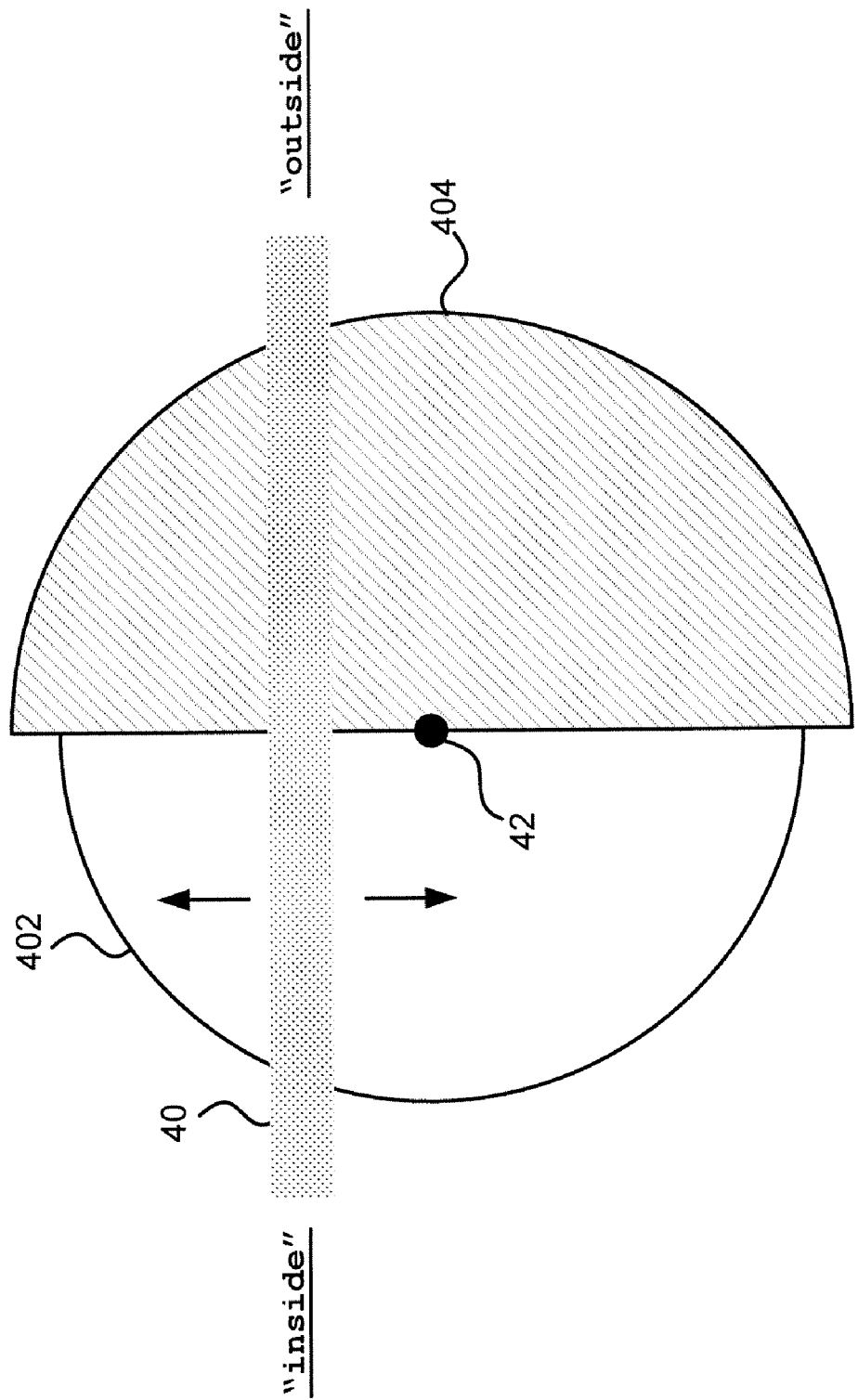
FIG. 4 illustrates an exemplary method for reducing contamination based on a half-moon shaped mask in accordance with an embodiment of the present disclosure.

FIG. 4 illustrates an exemplary method for reducing contamination based on a half-moon shaped mask 404 in accordance with an embodiment of the present disclosure. In this top view of a wafer 402, the half-moon shaped mask 404 is positioned to block the "outside" half of the wafer 402. A ribbon beam 40, which is slightly wider than the wafer 402, is generated and extends horizontally across the wafer 402.

During a first phase of ion implantation, the wafer 402 (and the mask 404) may be translated vertically with respect to the ion beam 40. Typically, the first phase may be completed with two full scans of the wafer 402 by the ion beam 40, e.g., by translating the wafer 402 (and the mask 404) up and down.

Upon completion of the first phase, the ion beam 40 may be turned off or otherwise kept off the wafer 402, and the wafer 402 may be rotated 180° around an axis 42. Then, a second phase of the ion implantation may be performed, wherein the half-wafer that was masked during the first phase may be implanted and the other half-wafer that was implanted during the first phase may be masked.

Figure 5:
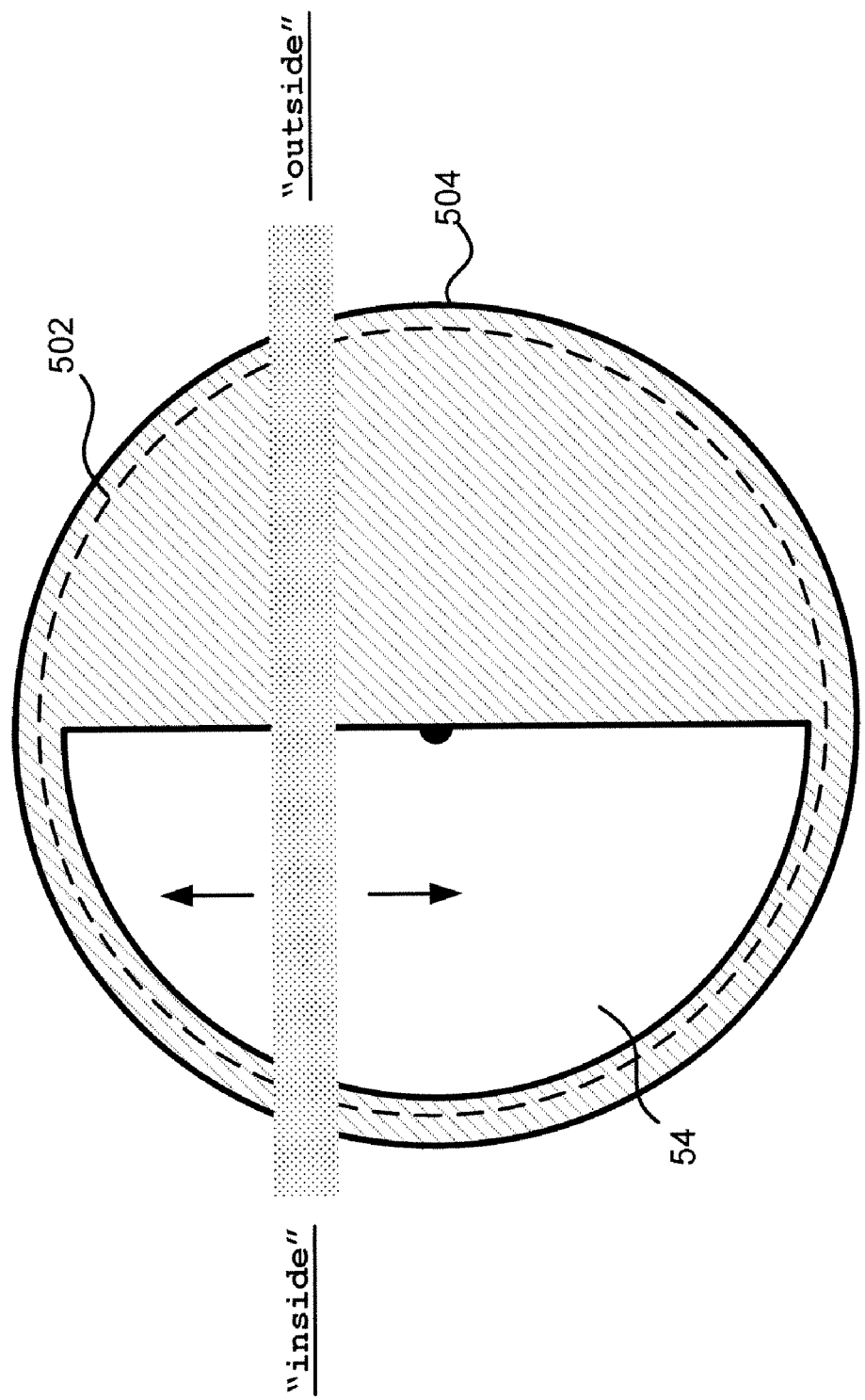
FIG. 5 shows an exemplary mask having a half-moon shaped aperture in accordance with an embodiment of the present disclosure.

FIG. 5 shows an exemplary mask 504 having a half-moon shaped aperture 54 in accordance with an embodiment of the present disclosure. The mask 504 may serve the same purpose of masking a wafer 502 as the mask 404 shown in FIG. 4. However, since the mask 504 has an overall shape and size similar to the wafer 502, the mask 504 may be more easily handled by the same automated wafer handling system (not shown) that handles the wafer 502.

FIG. 6 illustrates an exemplary method for reducing contamination based on two complementary masks or an adjustable mask in accordance with an embodiment of the present disclosure. The exemplary embodiments illustrated in FIGS. 3-5 all involve half-moon shaped masks that block exactly one half of a target wafer during each phase of ion implantation. However, a wafer mask in accordance with embodiments of the present disclosure does not have to be one half the wafer size or in the shape of a semi-circular disk.

FIG. 6 shows one scenario where it may be determined that only a small area 60 on the right side ("outside") of a wafer 602 is affected by contamination ions. Accordingly, during a first phase of ion implantation, a mask 604a may be positioned in front of the wafer 602. The mask 604a may have a solid portion that blocks the area 60 and may have an aperture 64a that exposes the rest of the wafer surface 602. Upon completion of the first phase of ion implantation, the wafer 602 may be rotated 180° such that the previously blocked area 60 is now on the left side ("inside"). A mask 604b having a complementary shape of the mask 604a may be provided for a second phase of ion implantation. The mask 604b may be an entirely different wafer mask from the mask 604a. Alternatively, the mask 604b may be the same wafer mask as the mask 604a, wherein the wafer mask is adjustable to create the different masks 604a and 604b. The mask 604b may expose the previously masked portion (i.e., area 60) of the wafer 602 via an aperture 64b, and mask the portion of the wafer 602 that was already implanted during the first phase. After the second phase, the entire wafer 602 will have been implanted.

At this point it should be noted that the techniques for reducing contamination during ion implantation in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with contamination reduction in accordance with the present disclosure as described above. Alternatively, one or more processors operating in accordance with stored instructions may implement the functions associated with contamination reduction in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for reducing contamination during ion implantation, the apparatus comprising:
   a platen to hold a workpiece for ion implantation by an ion beam;
   a mask, located in front of the platen and downstream from a corrector magnet, to block the ion beam and at least a portion of contamination ions having a charge state different than a desired charge state from reaching a first portion of the workpiece during ion implantation of a second portion of the workpiece, wherein a position of the mask relative to the ion beam is chosen based on a likelihood of impact by the contamination ions; and
   a control mechanism, coupled to the platen, to reposition the workpiece to expose the first portion of the workpiece for ion implantation.

2. The apparatus according to claim 1, wherein the second portion comprises the remaining portion of the workpiece.

3. The apparatus according to claim 1, wherein the first portion comprises one half of the workpiece, and wherein the second portion comprises the other half of the workpiece.

4. The apparatus according to claim 3, wherein the mask has a semi-circular shape.

5. The apparatus according to claim 1, wherein the position of the mask remains in a fixed relative position with respect to the ion beam during the ion implantation of the first portion and the second portion of the workpiece.

6. The apparatus according to claim 1, wherein the mask is made from one or more materials selected from a group consisting of: silicon, carbon, and silicon carbide.

7. The apparatus according to claim 1, wherein the control mechanism repositions the workpiece by rotating the workpiece by a predetermined angle.

8. The apparatus according to claim 1, wherein the ion implantation on the first portion of the workpiece is based on a recipe different from the ion implantation on the second portion of the workpiece.

9. The apparatus according to claim 1, wherein the ion beam is a ribbon beam, and wherein the ion implantation of the first portion and the second portion of the workpiece is performed by translating the workpiece and the mask relative to the ribbon beam.

10. A method for reducing contamination during ion implantation, the method comprising the steps of:
    positioning a mask in front of a workpiece and downstream from a corrector magnet to block an ion beam and at least a portion of contamination ions having a charge state different than a desired charge state from reaching a first portion of the workpiece during ion implantation of a second portion of the workpiece, wherein a position of the mask relative to the ion beam is chosen based on a likelihood of impact by the contamination ions; and
    repositioning the workpiece, after the ion implantation of the second portion, to expose the first portion of the workpiece for ion implantation.

11. The method according to claim 10, wherein the position of the mask remains in a fixed relative position with respect to the ion beam during the ion implantation of the first portion and the second portion of the workpiece.

12. The method according to claim 10, wherein the second portion comprises remaining portion of the workpiece.

13. The method according to claim 10, wherein the first portion comprises one half of the workpiece, and wherein the second portion comprises the other half of the workpiece.

14. The method according to claim 13, wherein the mask has a semi-circular shape.

15. The method according to claim 13, wherein the mask has a rectangular shape.

16. The method according to claim 10, wherein the step of repositioning the workpiece comprises a step of rotating the workpiece by a predetermined angle.

17. The method according to claim 10, wherein the ion implantation on the first portion of the workpiece is based on a recipe different from the ion implantation on the second portion of the workpiece.

18. The method according to claim 10, wherein the ion beam is a ribbon beam, and wherein the ion implantation of the first portion and the second portion of the workpiece is performed by translating the workpiece and the mask relative to the ribbon beam.

19. The apparatus according to claim 1, wherein the charge state is a singly charged state and the desired charge state is a doubly charged state.

20. The method according to claim 10, wherein the charge state is a singly charged state and the desired charge state is a doubly charged state.

* * * * *